United States Patent [19]
Christiansen

[11] Patent Number: 6,054,891
[45] Date of Patent: Apr. 25, 2000

[54] SOLID STATE RELAY

[75] Inventor: Uffe Noe Christiansen, Hadsten, Denmark

[73] Assignee: Carlo Gavazzi AG, Steinhausen, Switzerland

[21] Appl. No.: 09/040,462

[22] Filed: Mar. 18, 1998

[30] Foreign Application Priority Data

Mar. 18, 1997 [EP] European Pat. Off. .............. 97104610

[51] Int. Cl.$^7$ ........................ H03K 17/72; H03K 17/725
[52] U.S. Cl. ........................................... 327/438; 327/453
[58] Field of Search .................................. 327/438, 440, 327/442, 443, 445–447, 451, 452, 453; 363/96, 97

[56] References Cited

U.S. PATENT DOCUMENTS

| | | | |
|---|---|---|---|
| 4,016,391 | 4/1977 | Kiuchi et al. | 327/443 |
| 4,129,818 | 12/1978 | Goto et al. | 322/10 |
| 4,145,592 | 3/1979 | Mizukawa et al. | 219/625 |
| 4,529,931 | 7/1985 | Kuhns | 324/117 |
| 4,876,468 | 10/1989 | Libert | 327/438 |
| 5,107,412 | 4/1992 | Fuchs | 363/96 |
| 5,383,082 | 1/1995 | Nishizawa | 361/93 |

FOREIGN PATENT DOCUMENTS

| | | |
|---|---|---|
| 0 427 412 A2 | 5/1991 | European Pat. Off. . |
| 19 46 331 | 3/1971 | Germany . |

OTHER PUBLICATIONS

"Solid State AC Circuit Breaker", PROC. IEE, vol. 126, 1, Jan. 1979, pp. 75–76, XP002035029, M. Khalifa, Arifur Rahman, Syed Enamul–Haque.

European Search Report dated Jul. 18, 1997.

*Primary Examiner*—Tuan T. Lam
*Attorney, Agent, or Firm*—Nixon Peabody LLP; Donald R. Studebaker

[57] ABSTRACT

A solid state relay includes a power semiconductor controlled by a gate electrode. A current detector provides a signal which is a function of the absolute value of the current through the power semiconductor. An evaluation circuit coupled to the current detector receives the current signal. The current detector may include a ferromagnetic core surrounding a conductor coupled to the power semiconductor, a coil wound around the core, and an oscillator generating a carrier signal and a detection circuit, both coupled to the core. The current detector is used to control latching of the relay and to generate status signals if predetermined parameters are exceeded.

29 Claims, 6 Drawing Sheets

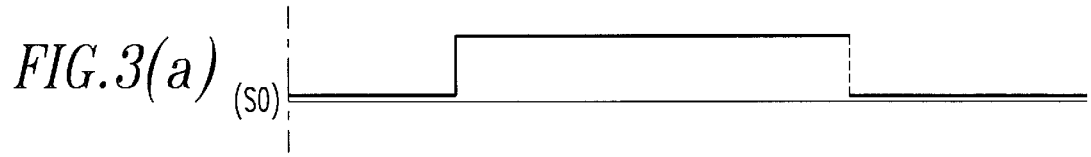
FIG.3(a) (S0)
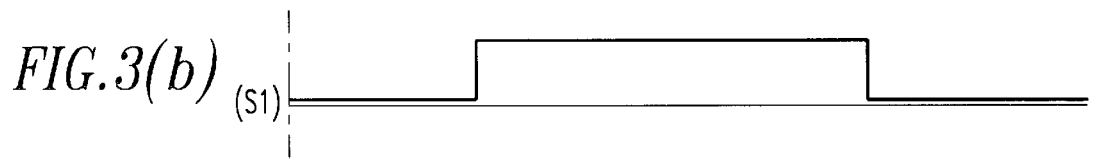
FIG.3(b) (S1)
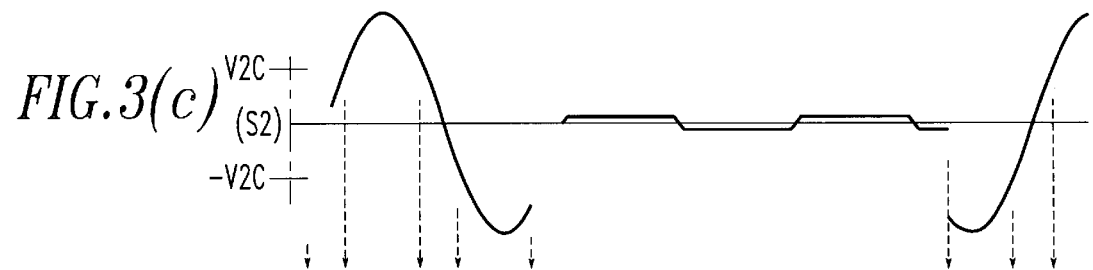
FIG.3(c) (S2)
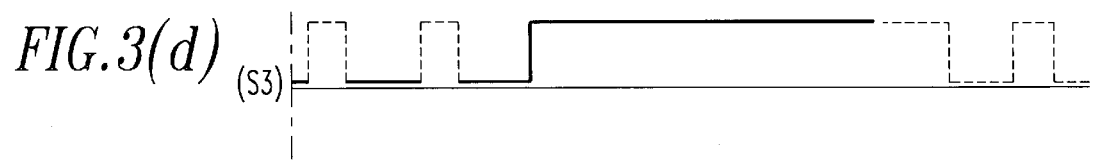
FIG.3(d) (S3)
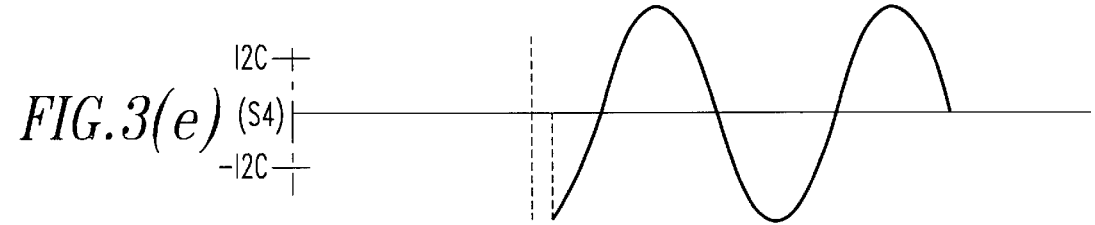
FIG.3(e) (S4)
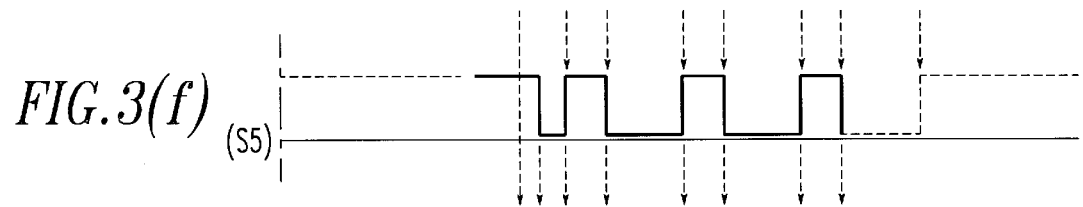
FIG.3(f) (S5)
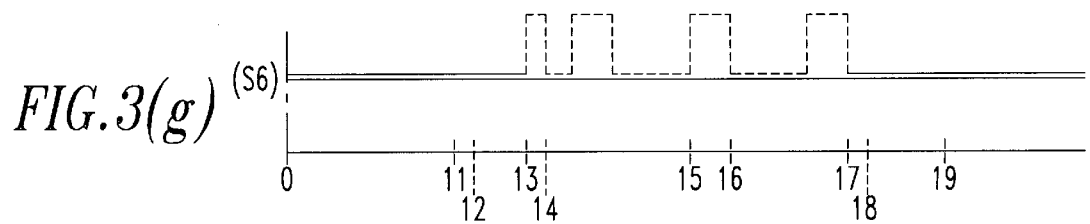
FIG.3(g) (S6)

SOLID STATE RELAY

BACKGROUND OF THE INVENTION

1. Field of the Invention

The present invention generally relates to the field of electrical and/or electronic devices. In particular, the present invention relates to solid state relays.

2. Description of Related Prior Art

Electrical and/or electronic devices of all kind are commonly very sensitive to interferences by ambient electromagnetic noise.

A solid state relay has all its components made from solid state devices and involves no mechanical movement. They are compatible with digital circuitry and have a wide variety of uses with such circuits.

Compared to electromechanical relays, solid state relays have several advantages including an increased lifetime, particularly at a high rate of switching; an elimination of contact bounce; decreased electrical noise; compatibility with digital circuitry; the ability to be used in explosive environments since there are no contacts across which arcs can form; and low voltage turn-on that reduces both the electromagnetic interference and stress on the attached load. The lack of physical contacts and moving elements also provides increased resistance to corrosion and the elimination of mechanical noise.

However, typical prior art solid state relays exhibit various disadvantages including the generation of a substantial amount of heat at a current above several amperes necessitating some form of cooling, and greatly increased production costs for multiple devices compared to single pole devices. Apart from the fact that typical prior art solid state relays usually are very costly to manufacture, they have high leakage current and are prone to false triggering.

The bottom line is that conventional solid state relays do not always produce reliable and satisfactory results. Furthermore, prior art solid state relays are relatively expensive and difficult to produce and operate because of their large number of internal components. Finally, prior art solid state relays are quite large compared to other electrical components, making their inclusion in widely-developed, miniature electrical devices a costly endeavor.

In this context, it should be noted that conventional solid state relays often comprise one or more switching devices which when used in direct current (DC) circuits require a single trigger pulse to turn the switching device ON. The switching device remains switched ON until the current drawn by the device falls below a threshold value, at which point the switching device turns OFF and requires a fresh trigger pulse before it will turn ON again.

When the switching device is used in an alternating current (AC) circuit, a continuous trigger signal is supplied to the switching device to prevent the device switching OFF when the current passes through a zero level. This is somewhat wasteful of power since the trigger circuit is drawing a continuous supply of current.

When the load which the device controls is an inductive load, like an electric motor, the continual switching produced by the device produces radio frequency interference. In many situations such interference is unacceptable and must be suppressed with a suppression circuit of the type which includes a suppression inductor and a suppression capacitor. These additional components may well double the cost of the device.

It is clear that a need exists for an improved solid state relay that overcomes the shortcomings of these prior art relays.

SUMMARY OF THE INVENTION

According to the present invention, an improved solid state relay is provided which is able to monitor certain parameters of the main power source such as for example output load voltage, output load current, phase shift between voltage and current, and to generate status signals if certain limits for the above parameters are exceeded.

It is an object of the invention to provide a solid state relay which is able to detect voltage zero crossings and current zero crossings and to obtain a control signal on the basis of such detection.

It is a further object of the present invention to provide a solid state relay that comprises at least one power semiconductor including two electrodes, at least one current detector coupled to the main path of the power semiconductor and at least one evaluation circuit coupled to the current detector to receive a signal indicative of certain parameters.

It is additionally an object of the present invention to provide a solid state relay comprising at least one voltage detector coupled to the power semiconductor and at least one evaluation circuit.

It is also an object of the present invention to provide a solid state relay wherein an evaluation circuit is coupled through at least one galvanic isolator to an output terminal of the solid state relay, thereby obtaining a safe isolation between the main power source and the monitoring part of the relay. The galvanic isolator is preferably an opto-coupler, a magneto-coupler or a piezoelectric-coupler.

It is still another object of the present invention to provide a solid state relay in which an evaluation circuit is coupled to or includes a current zero crossing detector and/or voltage zero crossing detector. The evaluation circuit of the solid state relay includes a gate circuit for generating a control signal which is supplied to the gate electrode of the power semiconductor thereby inducing low noise operation at zero crossings of the main voltage and main current.

It is additionally an object of the present invention to provide a solid state relay in which a voltage zero crossing detector and a current zero crossing detector may be coupled to a gate circuit in order to determine those instants of time at which low noise switching is possible.

It is an object of the present invention to provide a solid state relay in which an evaluation circuit includes a monitor circuit for monitoring voltage and current conditions wherein the solid state relay can monitor the main line conditions and may shut down the power semiconductor if an overload or other malfunction is detected. The monitor circuit may additionally include a phase shift calculator to generate an output signal when there is a phase shift between voltage and current that is outside given limits.

It is also an object of the present invention to provide a solid state relay comprised of at least two terminals connected to a load and a main power source for switching the current passing through the load on and off. The power semiconductor may be connected across the terminals in such a way that one of the two electrodes of the power semiconductor is connected to one of the two terminals and the other of the two electrodes of the power semiconductor is connected to the other of the terminals.

It is additionally an object of the present invention to provide a solid state relay wherein the main power source is an alternating current (AC) power source.

It is yet an additional object of the present invention to provide a solid state relay comprised of a gate pulse generator coupled to the evaluation circuit wherein the gate pulse generator includes an amplifier to generate a trigger signal for the power semiconductor.

It is also an object of the present invention to provide a solid state relay comprised of a power semiconductor further comprised of a silicon-controlled rectifier (SCR), a bidirectional triode thyristor (TRIAC) or an altemistor.

It is still another object of the present invention to provide a solid state relay wherein the voltage zero crossing detector generates a logical signal indicating whether the absolute value of the voltage across the power semiconductor is higher or lower than a certain level.

It is further an object of the present invention to provide a solid state relay wherein the current zero crossing detector generates a logical signal indicating whether the absolute value of the current through the main path of the power semiconductor is higher or lower than a certain level.

It is an object of the present invention to provide a solid state relay wherein an evaluation circuit generates an output signal indicating if the voltage zero crossing detector and the current zero crossing detector generate output signals indicating a voltage zero condition and a current zero condition simultaneously.

It is also an object of the present invention to provide a solid state relay wherein an evaluation circuit is comprised of an AND-gate.

It is additionally an object of the present invention to provide a solid state relay wherein an evaluation circuit is comprised of an OR-gate.

It is also an object of the present invention to provide a solid state relay comprised of a power supply which may include the secondary side of a DC/DC-converter. The power supply further comprises an input for a control signal that is galvanically isolated from the main power source by means of the DC/DC converter of the power supply without there being any need to provide a specific means for galvanically isolating the control input terminal.

It is also an object of the present invention to provide a solid state relay comprised of a current detector further comprised of a sensor including a ferromagnetic core at least partially surrounding the main path, a coil wound at least partially around the core, an oscillator generating a carrier signal coupled to the sensor, and a detection circuit coupled to the sensor. The frequency of the carrier signal may be several times higher than the frequency of the main power source and the detection circuit may be an AM-demodulator. The use of a current sensor of that kind is advantageous because no resistive load must be inserted in the main path which would cause a power dissipation and the production of heat especially in cases in which high currents are to be processed. The sensor comprising a toroidal core and a coil wound around the core may be very small and inexpensive in comparison to the use of a transformer which would require a large number of voluminous secondary windings.

It is also an object of the present invention to provide a solid state relay wherein a ferromagnetic core has a magnetic permeability such that it is close to its magnetic saturation for the maximum current to be expected in the main path.

It is additionally an object of the present invention to provide a solid state relay comprised of a current detector further comprised of a filter with a coil constituting a part of the filter so that the transfer function of the filter may depend on the inductance of the coil which itself depends on the magnetic saturation of the core. It is preferable that the filter is a high-pass filter whose cutoff frequency is dependent on the inductance of the coil.

Other objects, advantages and features of the present invention will become apparent to those skilled in the art from reading the following description in conjunction with the drawings and the claims.

BRIEF DESCRIPTION OF THE DRAWINGS

Solid state relays according to the present invention will be described in more detail below with reference to exemplary embodiments which are diagrammatically illustrated in the accompanying drawings, in which:

FIGS. 3(a)–3(g) are wave form diagrams showing signal wave forms at specific view points of the circuit diagram of FIG. 1;

DETAILED DESCRIPTION OF THE PREFERRED EMBODIMENTS

Figure 1:
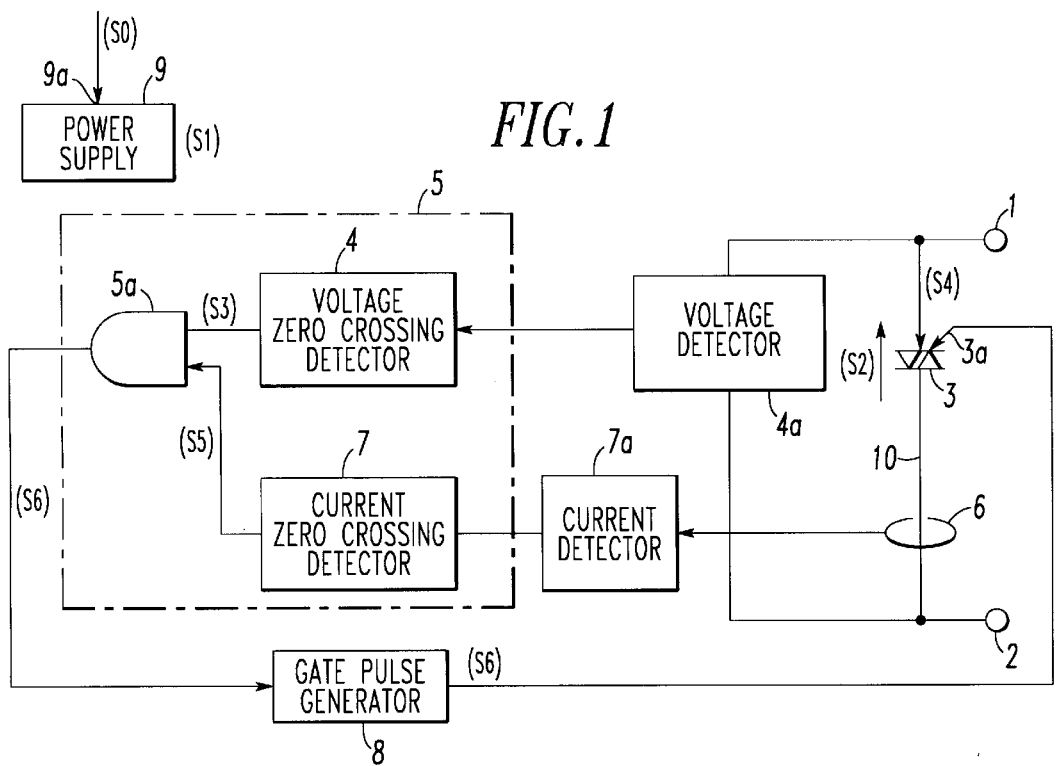
FIG. 1 is a circuit diagram of an embodiment of a solid state relay according to the present invention.

The solid state relay shown in FIG. 1 comprises a pair of terminals 1 and 2. These terminals 1 and 2 are normally connected to an inductive load (not shown) and a main power source (not shown) in such manner that a current can flow through the load, when the terminals 1 and 2 are bridged. Connected across the terminals 1 and 2 is a power semiconductor 3 in such a way that the two electrodes of its main path 10 are connected to the terminals 1 and 2. In this specific example, the power semiconductor 3 is a silicon-controlled rectifier (SCR) such as a bidirectional triode thyristor (TRIAC).

Connected in parallel to the power semiconductor 3 is a voltage detector 4a for sensing the voltage across the power semiconductor 3. An output of the voltage detector 4a is connected to the first input of an evaluation circuit 5.

A current sensor 6 is coupled to the main path 10 of the power semiconductor 3. The current sensor 6 is connected to an input of a current detector 7a, the output of which is connected to a second input of the evaluation circuit 5. The output of the evaluation circuit 5 is connected via a gate pulse generator 8 to the gate 3a of the power semiconductor 3.

The voltage detector 4a, the evaluation circuit 5, the current detector 7 and the gate pulse generator 8 receive electric power from a power supply 9. The respective connections between the power supply 9 and the several components are, however, not shown in FIG. 1 for the sake of clarity. The power supply 9 can be switched on and off through its input terminal 9a.

The evaluation circuit 5 includes a voltage zero crossing detector 4 coupled to the output of voltage detector 4a and a current zero crossing detector 7 coupled to the output of current detector 7a. The outputs of the voltage zero crossing detector 4 and the current zero crossing detector 7 are coupled to the two inputs of an AND gate circuit 5a, the output of which is coupled to gate pulse generator 8.

The evaluation circuit 5 and the gate pulse generator 8 are designed to produce a gate impulse for firing the power semiconductor 3 if and only if the following three conditions apply simultaneously:

a) the power supply 9 is switched in the ON state, b) the voltage across the power semiconductor 3 along its main path 10 lies in the voltage zero range detected by the voltage zero crossing detector 4, and c) the load current lies in the load current zero range detected by the current zero crossing detector 7.

Figure 2:
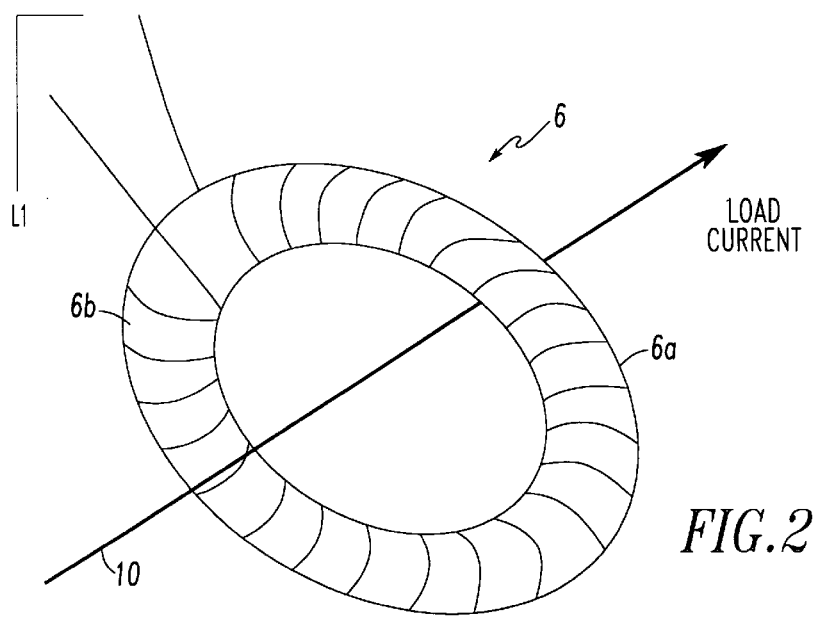
FIG. 2 is a perspective view of a current sensor used in the solid state relay of FIG. 1.

Details of the inductive current sensor 6 are explained with reference to FIG. 2. The current sensor 6 comprises a toroidal ferromagnetic core 6a and a coil 6b wound around it. The main path 10 carrying the load current to be measured penetrates the core in its center. The load current flowing in the main path 10 generates a magnetic flux. The inductance L1 of the coil 6b depends on the magnetic saturation of the core. If the load current in the main path 10 is zero, the inductance L1 of the coil 6b will have its maximum value because the load current does not generate an additional flux inside the core. A sufficiently high load current will introduce a saturation of the core and the inductance L1 of the coil 6b will be at its lowest value (almost zero).

The inductive current sensor 6 is designed in such a way that the value of the load current that will introduce complete saturation is chosen in a certain current range (e.g., $I_H$ and $I_I$), with a certain safety margin. In this way the inductance L1 of the coil 6b represents the absolute value of the load current in a range of 0 to $I_{L,MAX}$, where $I_{L,MAX}$ equals 2 Amperes.

FIG. 3 shows several signal wave forms taken at points S0 (cf. FIG. 3a), S1 (cf. FIG. 3b), S2 (cf. FIG. 3c), S3 (cf. FIG. 3d), S4 (cf. FIG. 3e), S5 (cf. FIG. 3f) and S6 (cf. FIG. 3g) which are marked accordingly in FIG. 1. The following description refers to certain time instants 0, t1, t2, t3, t4, t5, t6, t7, t8 and t9 indicated at the bottom of FIG. 3.

At time instant 0 a main power source is connected in series with an inductive load to the terminals 1 and 2 of the solid state relay. However, the power supply 9 does not receive a control signal, therefore the gate pulse generator 8 is not supplied with power and does not produce any gate signal so that the power semiconductor 3 is in the OFF state.

As can be seen from FIG. 3a, at time instant t1, a control signal is applied to the control input 9a of the power supply 9 (i.e., S0 changes from a low level to a high level.) With a little time delay the power supply 9 delivers power (represented by S1 in FIG. 3b) to the various components of the solid state relay.

The signal S2 in FIG. 3c represents the voltage across the power semiconductor 3 along its main path 10. Since the main power source is an AC source, the voltage has the form of a sine wave. The voltage limits −VZC and VZC on opposite sides of the zero voltage line define the range of voltage zero crossing periods. In other words, if the voltage falls into the range between −VZC and VZC a voltage zero crossing is assumed. The voltage zero crossing detector 4 generates a voltage zero crossing signal as long as the voltage falls into the range between −VZC to VZC.

The output signal S3 of the voltage zero crossing detector 4 is shown in FIG. 3d. Since, however, during the time period from 0 to t2 the power supply 9 is off, there is actually no voltage zero crossing signal S3 and the signal is therefore shown in dotted lines. At time instant t2, when the voltage zero crossing detector 4 is energized, the voltage is outside the zero crossing range in this example. Therefore the signal S3 indicates that there is no voltage zero crossing and therefore the generation of a gate pulse is blocked. At time instant t3 the voltage falls in the limit of the voltage zero crossing range and therefore the signal S3 changes to indicate that there is a voltage zero crossing.

The signal S4 in FIG. 3e represents the current flowing through the main path 10 of the power semiconductor 3. As discussed above, during the time period from 0 to t4 the power semiconductor 3 is in its OFF state so that there is no load current flowing.

Accordingly, the current zero crossing detector 7 indicates by means of its output signal S5 (cf. FIG. 3f) that there is no current during the time period from 0 to t4.

Since there is zero voltage (cf. S3) and zero current (cf. S5) detected at time instant t4 a gate pulse S6 (cf. FIG. 3g) is generated causing the power semiconductor 3 to pass into its ON state and a load current flows through the main path 10 between the terminals 1 and 2.

Returning now to FIG. 3c, it will be appreciated that after time instant t4 where the power semiconductor 3 is in its conductive (ON) state the voltage across it falls down almost to zero as indicated by signal S2. Accordingly, signal S3 (cf. FIG. 3d) remains in the state indicating that there is voltage zero condition.

As shown by signal S4 (cf. FIG. 3e; t4 to t9), the wave form of the current through the power semiconductor 3 is phase-shifted with regard to the voltage wave form S2 due to the inductive load connected to one of the terminals 1 and 2 and the main power source. During time periods in which the current signal S4 falls in the range between −IZC and IZC (cf. FIG. 3e) the current zero crossing detector 7 detects current zero crossing condition and outputs a corresponding pulse signal S5 (cf. FIG. 3f). A gate pulse S6 (cf. FIG. 3g) corresponding to the pulse signal S5 of FIG. 3f is forwarded to the gate electrode 3a of the power semiconductor 3 because the output signal S3 of the voltage zero crossing detector 4 permanently indicates voltage zero condition and thus the requirements for generating a gate pulse (current zero and voltage zero) are fulfilled. Therefore, during each period of current zero crossing the power semiconductor 3 receives the gate pulse which prevents the power semiconductor 3 from being extinguished.

Returning now to FIG. 3a, at time instant t7 the control input S0 goes down, indicating that the solid state relay should be switched off. Accordingly, the power supply S1 goes down at time instant t8 with a certain time delay (cf. FIG. 3b). At this time instant t8, however, the current (signal S4; FIG. 3e) is outside the zero crossing range and the power semiconductor 3 is latched in its conductive (ON) state and remains conductive even without receiving a gate pulse. However, as soon as the current falls below the latch current which is still lower than IZC the power semiconductor 3 is extinguished because there is no longer any gate pulse due to the turning off of the power supply S1. So the solid state relay is switched off at time instant t9 and the main power source voltage across the power semiconductor 3 (signal S2; cf. FIG. 3c) appears again. Due to the described timing of firing and extinguishing the power semiconductor 3 there is a minimum emission to the main power source.

Figure 4:
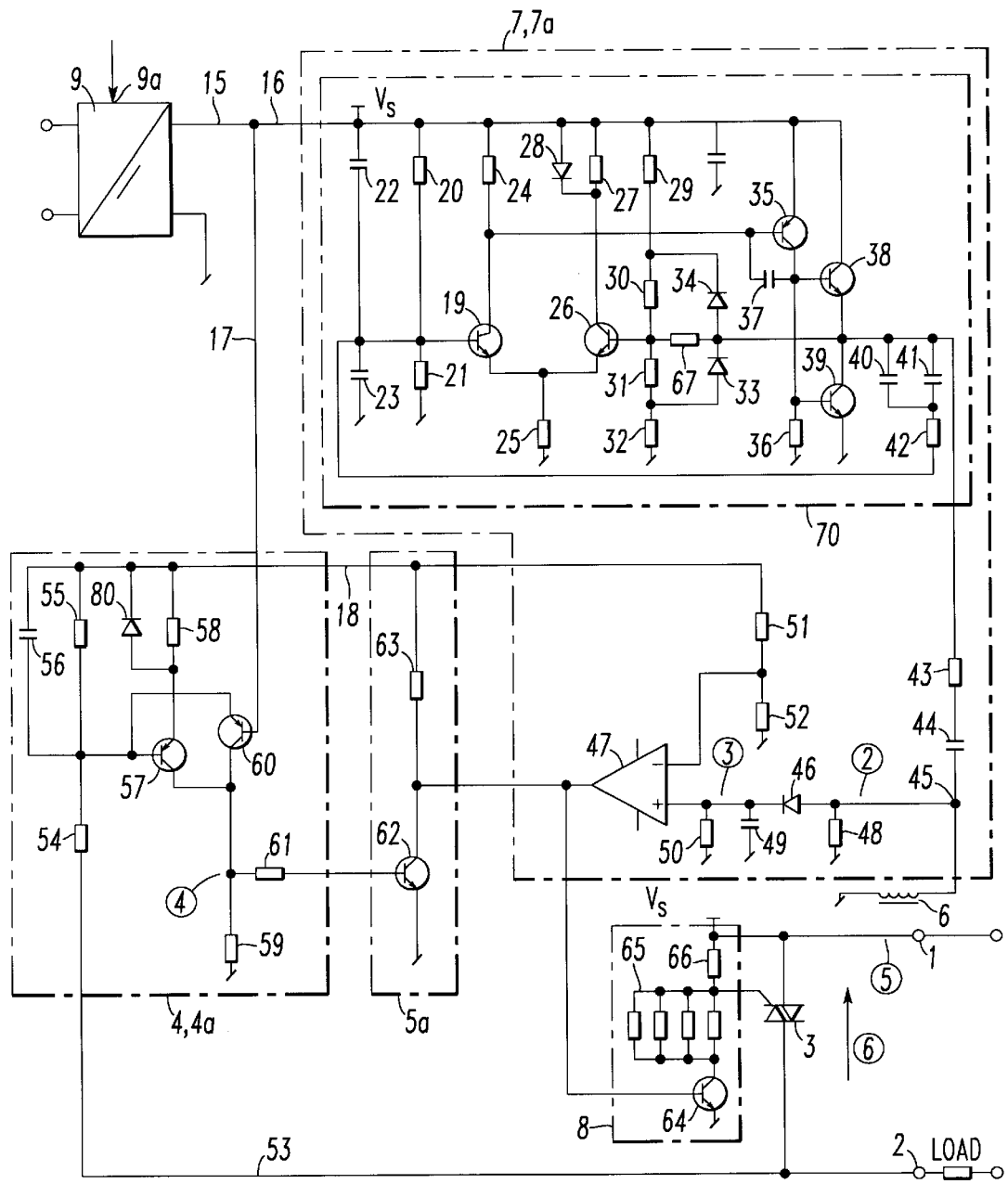
FIG. 4 is a detailed circuit diagram of another embodiment of a solid state relay according to the present invention.

FIG. 4 shows the detailed construction of a further embodiment of the solid state relay according to the present invention. The solid state relay shown in FIG. 4 comprises the elements already described with respect to the embodiment of FIG. 1, namely terminals 1 and 2, a power semiconductor 3, a voltage zero crossing detector 4, including a voltage detector 4a, a gate circuit 5a, a current sensor 6, a current zero crossing detector 7, including a current detector 7a, a gate pulse generator 8 and a power supply 9 including a control input 9a.

The DC output 15 of the power supply 9 is connected to the current zero crossing detector 7 through line 16, to the voltage zero crossing detector 4 through line 17 and to the evaluation circuit 5 through line 18. Further connection is made between the DC output 15 of the power supply 9 via points VS to the gate pulse generator 8, the line being omitted for the sake of clear representation.

The current zero crossing detector 7 includes an oscillator unit comprising a first transistor 19 the base electrode of which is connected to a tap point of a voltage divider consisting of two resistors 20 and 21 which bridge the supply voltage VS to ground. Parallel to the resistors 20 and 21 there are connected capacitors 22 and 23 respectively. The collector electrode of the transistor 19 is connected to the power supply 9 via a resistor 24. The emitter electrode is connected to ground via a resistor 25.

A second transistor 26 is connected with its collector electrode to the power supply 9 via a parallel circuit consisting of a resistor 27 and a diode 28. The emitter electrode of the second transistor 26 is connected via transistor 25 to ground. The base electrode of the second transistor 26 is connected to a voltage divider consisting of four resistors 29, 30, 31 and 32 which voltage divider bridges the supply voltage to ground. Parallel to the resistors 30 and 31 there are provided two diodes 33 and 34 connected in series in backward direction. The junction point between the diodes 33 and 34 is connected to the base electrode of the second transistor 26 via a resistor 67.

A third transistor 35 is connected with its emitter electrode to the supply voltage line 16 and with its collector electrode to ground via a resistor 36. The base electrode of the third transistor 35 is connected to the collector electrode of the first transistor 19. The base electrode and the collector electrode of the third transistor 35 are connected with each other over a capacitor 37.

A fourth transistor 38 is connected with its collector electrode to the supply voltage line 16 and with its base electrode to the collector electrode of the third transistor 35. The emitter electrode of the fourth transistor 38 is connected to the emitter electrode of a complementary transistor 39 the collector electrode of which is connected to ground. The base electrode of the complementary transistor 39 is connected to the base electrode of the fourth transistor 38. The junction point of the two emitter electrodes of the complementary transistors 38 and 39 is connected to the junction point between the diodes 33 and 34 and via the resistor 67 to the base electrode of the second transistor 26. The junction point between the complementary transistors 38 and 39 is further connected via a feedback loop to the base electrode of the first transistor 19 which feedback loop includes two parallel capacitors 40 and 41 and a serial resistor 42.

As far as described above, the circuit of the current zero crossing detector 7 functions as an oscillator 70 which produces a sine wave at the common emitter electrode of the complementary transistors 38 and 39, the frequency of the sine wave being several times higher than the frequency of the main power source.

The output signal obtained at the emitter electrodes of the complementary transistors 38 and 39 is channelled to a connection point 45 and is filtered in a filter consisting of a resistor 43, a capacitor 44 and the coil of sensor 6. The inductive current sensor 6 sensing the load current in the main path 10 is connected with one of its two terminals to the connection point 45 and with the other of its two terminals to ground. The connection point 45 is connected via a forward biased diode 46 to the non-inverting input of a threshold comparator 47. The anode of the diode 46 is also connected to ground via a resistor 48. The cathode of the diode 46 is connected to ground via a capacitor 49 which acts as a low pass filter. In parallel to the capacitor 49 is connected a resistor 50. The inverting input of the threshold comparator 47 is connected to the tap point of a voltage divider consisting of two serial resistors 51 and 52 connected between the voltage of the power supply 9 and ground.

Having now described the construction of the current zero crossing detector 7, including the current detector 7a, a description will be given of the voltage zero crossing detector 4, including the voltage detector 4a. The voltage across the power semiconductor 3 with reference to the supply voltage Vs is input to the voltage zero crossing detector 4 via line 53. Line 53 is connected to the supply voltage through a voltage divider consisting of two serial resistors 54 and 55. Resistor 55 is bridged in parallel by a capacitor 56. The tap point between resistors 54 and 55 is connected to the base electrode of a transistor 57, the emitter electrode of which is connected to the supply voltage via a resistor 58 and a zener diode 80 which is parallel to the resistor 58. The collector electrode of transistor 57 is connected to ground via a resistor 59. The base electrode of the transistor 57 is also connected to the emitter electrode of a further transistor 60 the collector electrode of which is connected to ground via resistor 59. The collector electrodes of the transistors 57 and 60 which are connected in common to resistor 59 are also connected to a resistor 61 at which the output signal of the voltage zero crossing detector 4 is obtained.

Having now described the construction of the voltage zero crossing detector 4, a description will be given of the gate circuit 5a. The gate circuit 5a comprises a transistor 62 the emitter electrode of which is connected to ground and the collector electrode of which is connected to the supply voltage line via a resistor 63. The resistor 61, i.e. the output of the voltage zero crossing detector 4 is connected to the base electrode of the transistor 62 of the gate circuit 5a. The output of the threshold comparator 47, i. e. the output of the current zero crossing detector 7 is connected to the collector electrode of the transistor 62 of the gate circuit 5a.

Having now described the construction of the gate circuit 5a, a description will be given of the gate pulse generator 8. The gate pulse generator 8 comprises a transistor 64 the emitter electrode of which is connected to ground and the collector electrode of which is connected to the supply voltage VS via a parallel resistor network 65 and serial resistor 66. In the embodiment of FIG. 4, the parallel resistor network 65 consists of four resistors connected in parallel. The gate electrode of power semiconductor 3 is connected to a tap point between the parallel resistor network 65 and the resistor 66.

The function of the circuit of FIG. 4 will now be explained with reference to the wave form signals represented in FIG. 5. In other words, FIG. 5 represents wave forms taken at several view points, i. e. view point (5) (cf. FIG. 5a), view point (2) (cf. FIG. 5b), view point (3) (cf. FIG. 5b), view point (6) (cf. FIG. 5c) and view point (4) (cf. FIG. 5d). The several view points are symbolized by encircled numerals in FIG. 4.

Figure 5A:
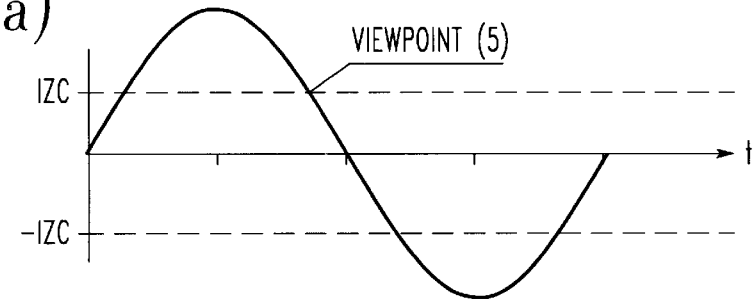
FIGS. 5(a)–5(d) are wave form diagrams showing signal wave forms at specific view points of the circuit diagram of FIG. 4.

FIG. 5a represents the signal taken at view point (5), i. e. the load current through the main path 10 of the power semiconductor 3 which is in the form of a sine wave. The horizontal dotted lines −IZC and IZC on opposite sides of the zero line define the range of current zero crossings.

Figure 5B:
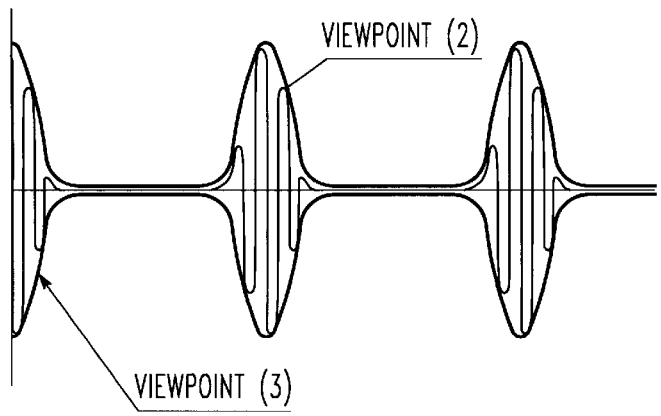

FIG. 5b shows the voltage taken at view points (2) and (3) respectively. The signal is an amplitude-modulated (AM) signal having a carrier frequency which is several times higher than the frequency of the main power source. The envelope signal has maxima in the range of current zero crossings and approaches zero during the other time periods in which the load current is outside the range of current zero crossings.

Figure 5C:
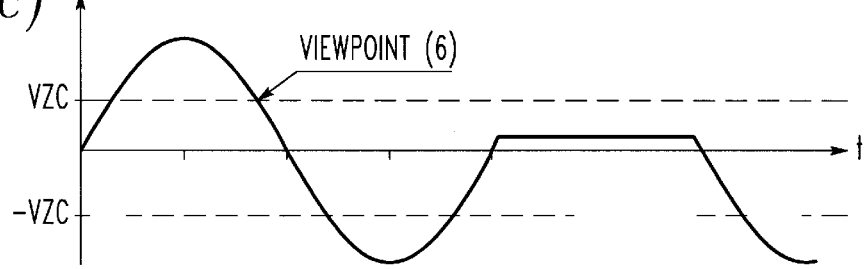

FIG. 5c represents the signal taken at view point (6), i. e. the voltage across the main path 10 of the power semiconductor 3. The horizontal dotted lines −VZC and VZC on opposite sides of the zero line define the range of voltage zero crossings. The voltage signal is sinusoidal, the frequency being given by the frequency of the main power source and being normally 50 Hz or 60 Hz. If the power semiconductor 3 is switched on the voltage remains close to the zero line.

Figure 5D:
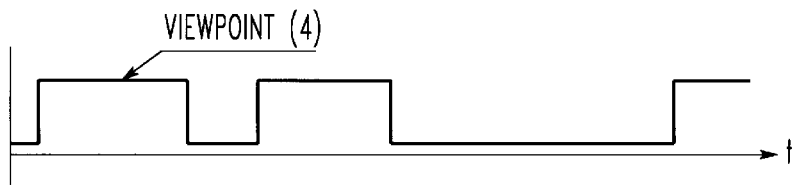

FIG. 5d shows the signal form taken at view point (4), i. e. the output of the voltage zero crossing detector 4. As can be taken from FIG. 5d, the output signal of the voltage zero crossing detector 4 is at a high level during time periods in which the voltage over the power semiconductor 3 is outside the range of voltage zero crossings and is at a low level during time periods in which the voltage over the power semiconductor 3 is inside the range of voltage zero crossings.

It should be noted that the signal taken at view point (4) of the embodiment shown in FIG. 4 is inverted with regard to the corresponding signal (cf. FIG. 3d) of the embodiment illustrated in FIG. 1 and FIG. 3. The same holds true for the output signal of the current zero crossing detector 7. For this reason the gate circuit 5a in the present embodiment is designed accordingly to process inverted signals and the gate pulse generator 8 of FIG. 4 has additionally the function of an inverter (A OR B=NOT (NOT A AND NOT B)). This design results in functional operation of the solid state relay which can be summarized as follows: a gate impulse for the power semiconductor 3 is produced if and only if the following three conditions apply simultaneously:

a) the power supply 9 is switched in the ON state, b) the voltage across the power semiconductor 3 along its main path 10 lies in the voltage zero range detected by the voltage zero crossing detector 4, and c) the load current lies in the load current zero range detected by the current zero crossing detector 7.

Figure 6:
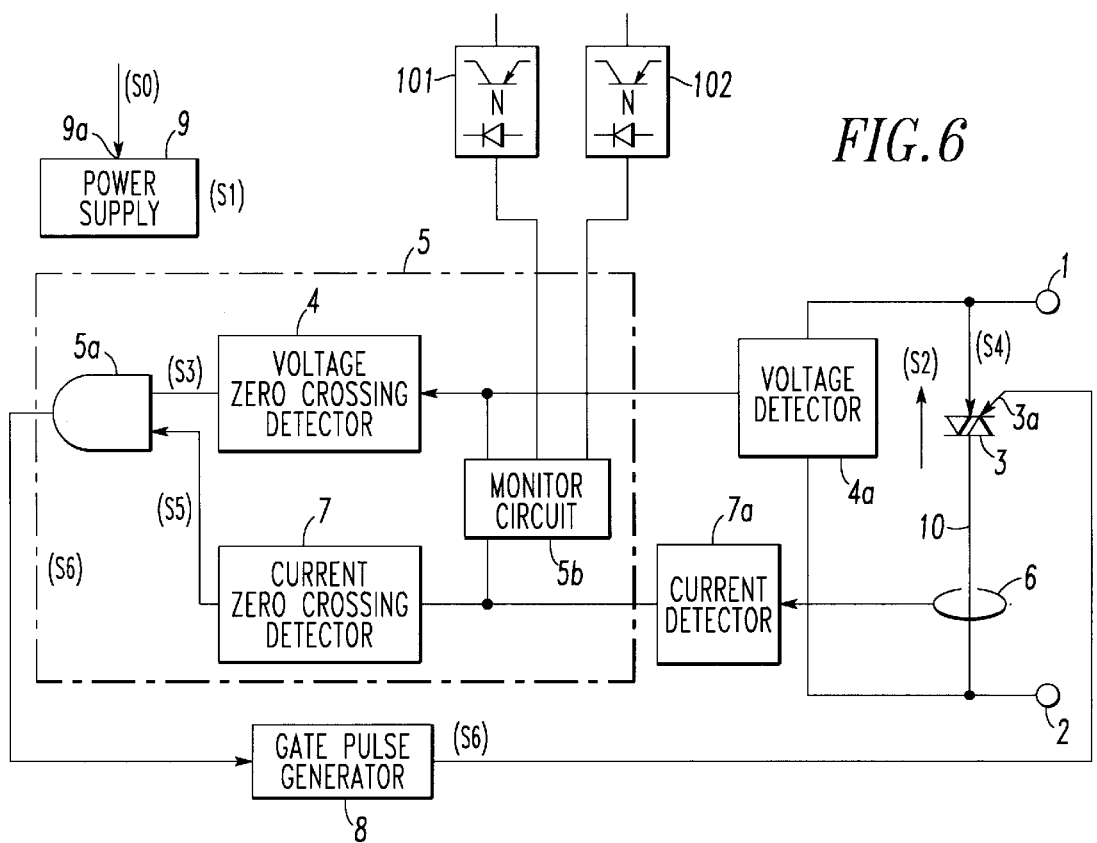
FIG. 6 is a circuit diagram of a further embodiment of a solid state relay according to the present invention.

FIG. 6 is a circuit diagram of a further embodiment of a solid state relay according to the present invention. The solid state relay shown in FIG. 6 comprises a pair of terminals 1 and 2. These terminals 1 and 2 are normally connected to an inductive load (not shown) and a main power source (not shown) in such manner that a current can flow through the load, when the terminals 1 and 2 are bridged. Connected across the terminals 1 and 2 is a power semiconductor 3 in such a way that its two electrodes of its main path 10 are connected to the terminals 1 and 2. In this specific example, the power semiconductor 3 is a silicon-controlled rectifier (SCR) such as a bidirectional triode thyristor (TRIAC).

In parallel to the power semiconductor 3 there is connected a voltage detector 4a sensing the voltage across the power semiconductor 3. An output of the voltage detector 4a is connected to the first input of an evaluation circuit 5. A current sensor 6 is coupled to the main path 10 of the power semiconductor 3. The current sensor 6 is connected to an input of a current detector 7a, the output of which is connected to a second input of the evaluation circuit 5. The output of the evaluation circuit 5 is connected via a gate pulse generator 8 to the gate 3a of the power semiconductor 3.

The voltage detector 4a, the evaluation circuit 5, the current detector 7 and the gate pulse generator 8 receive electric power from a power supply 9. The respective connections between the power supply 9 and the several components are however not shown in FIG. 6 for the sake of clarity. The power supply 9 can be switched on and off through its input terminal 9a.

The evaluation circuit 5 includes a voltage zero crossing detector 4 coupled to the output of voltage detector 4a as well as a current zero crossing detector 7 coupled to the output of current detector 7a. The outputs of the voltage zero crossing detector 4 and the current zero crossing detector 7 are coupled to the two inputs of a gate circuit 5a, the output of which is coupled to gate pulse generator 8.

The outputs of the voltage detector 4a and the current detector 7a are coupled to two inputs of a monitor circuit 5b. Two outputs of the monitor circuit 5b are coupled to opto-couplers 101 and 102, respectively. The monitor circuit 5b comprises threshold circuits (not shown) which produce an output signal if the load current and/or the load voltage exceed certain limits or if other malfunctions occur, such as for example a failure of the main power source or interruption in the load circuit. The output channels carry signals indicative of excess load or voltage, phase error, power socket failure, load circuit interruption, or other errors, and the output channels may be used to control external fault indicator, control, or signalling devices. The monitor circuit may also include a phase shift calculator generating an output signal if the calculated phase shift lies outside given limits. In the present example the monitor circuit has only two output channels. Needless to say, however, that further output channels can be provided depending on the specific application of the solid state relay.

The output signals of the monitor circuit are supplied to output terminals (not shown) of the solid state relay via opto-couplers 101 and 102 to make sure that the output terminals are galvanically isolated from the load circuit.

Figure 7:
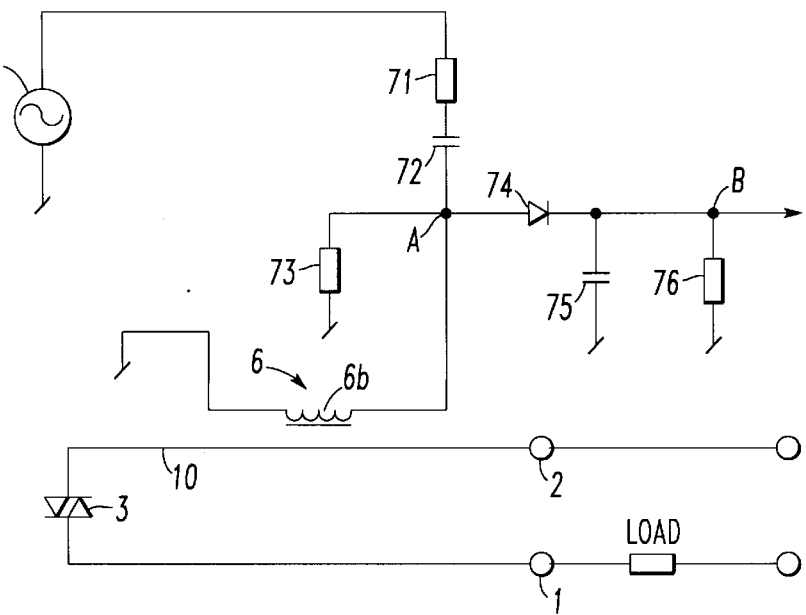
FIG. 7 shows in diagrammatic form the current detector 7a used in the embodiment of FIG. 6.

FIG. 7 shows in diagrammatic form the current detector 7a used in the embodiment of FIG. 6. The current detector comprises an oscillator 70 coupled to a resistor 71 which is coupled to a capacitor 72. The capacitor 72 is connected to ground via sensor 6. The sensor 6 is constructed as shown in FIG. 2 and comprises a toroidal core and a coil 6b wound around the core. The connection point A between the capacitor 72 and the sensor 6 is connected to ground via resistor 73. A diode 74 is connected with its anode to the connection point A and with its cathode to a capacitor 75 and to a resistor 76 which are connected with their other ends to ground. The output signal of the current detector is obtained at point B. The toroidal sensor 6 surrounds the main path 10 of triac 3 which is connected between terminals 1 and 2.

The above described elements 71, 72, 73, and 6 form a filter having a filter transfer function which depends on the inductance of the coil 6b of the sensor 6. However, the inductance of the sensor 6 depends itself on the magnetic field in the core (6a in FIG. 2) in such a manner that the inductance is low when the ferromagnetic core is close to its magnetic saturation and the inductance is high when the ferromagnetic core is far from reaching its saturation magnetization. Finally, the magnetization of the ferromagnetic core depends directly on the magnetic flux surrounding the main path and thus depends directly on the current in the main path. Therefore the transfer function of the above mentioned filter varies depending on the current in the main path, i.e. if the current is high the transfer coefficient of the filter is low and the carrier signal originating from the oscillator 70 is attenuated strongly. If the current in the main path is zero or low the transfer coefficient of the filter is high and the carrier signal is not attenuated or only slightly attenuated. As a result, the amplitude of the carrier signal is indicative of the current in the main path 10.

The amplitude of the carrier signal is detected in an AM-demodulator comprising diode 74, capacitor 75 and resistor 76, so that the amplitude signal, i.e. the demodulated signal representative of the current in the main path 10 is obtained at connection point B.

The above described method of detecting the current in the main path 10 allows measurement of the current without dissipating energy. It works for ac-currents and dc-currents in the main line as well since it does not require a voltage to be induced in a secondary winding of a transformer. Therefore transformers, which would have to include many windings in the secondary coil due to the fact that the primary consists only of a single straight wire, can be avoided.

Figure 8A:
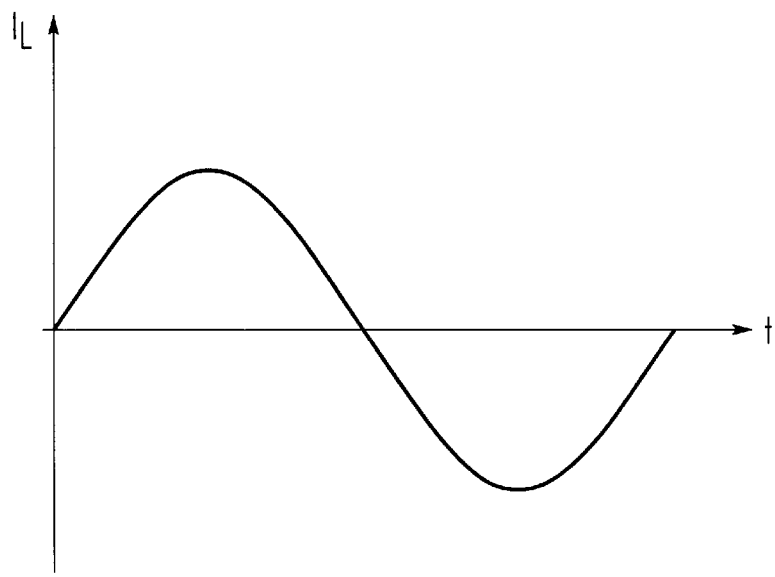
FIGS. 8(a)–8(b) are wave form diagrams showing specific signal wave forms in the current detector of FIG. 7.

FIG. 8 is a wave form diagram showing specific signal wave forms of the current detector of FIG. 7. FIG. 8a represents the current in the main path 10. The current has the form of a sine wave the frequency being 50 Hz, for example.

Figure 8B:
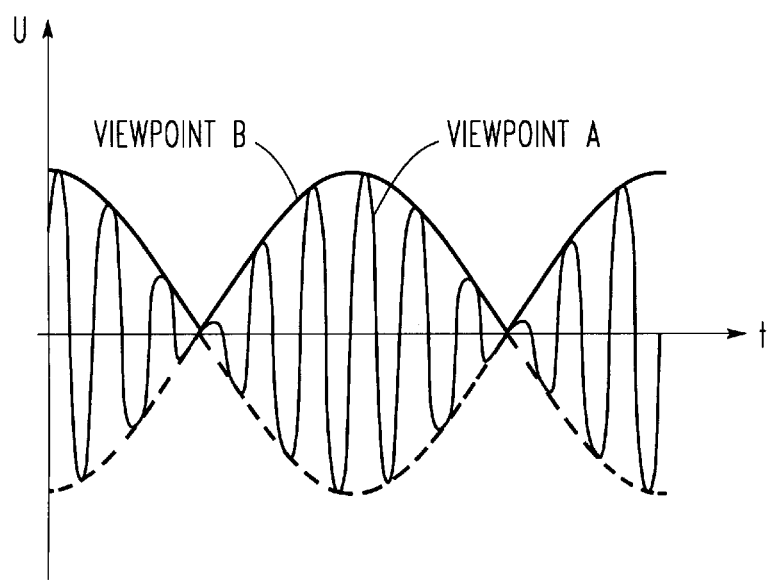

FIG. 8b shows the signals obtained at viewpoint A and at viewpoint B of FIG. 7. At viewpoint A the carrier signal originating from oscillator 70 is obtained, however, its amplitude varies such that it is high when the current in the main path is low and vice versa. The signal at viewpoint B is obtained from the signal at viewpoint A by demodulation, ie. rectification by diode 74 and filtering by capacitor 75. It corresponds to the positive amplitude of the signal at viewpoint A and is thus indicative of the current in the main path.

I claim:

1. A solid state relay comprising:
   a) at least one power semiconductor including a gate electrode and having two electrodes defining a main path;
   b) at least one current detector coupled to the main path of the power semiconductor and providing a signal which is a function of an absolute value of the current in the main path, wherein the at least one current detector includes a sensor having a ferromagnetic core at least partially surrounding the main path, a coil wound at least partially around the core, an oscillator generating a carrier signal coupled to the sensor and a detection circuit coupled to the sensor; and
   c) an evaluation circuit coupled to the current detector for receiving said signal and producing an output signal coupled to said gate electrode of said power semiconductor.

2. The solid state relay according to claim 1, further comprising at least one voltage detector coupled to the power semiconductor and to the evaluation circuit.

3. A solid state relay according to claim 1, wherein the evaluation circuit is coupled through at least one galvanic isolator to an output terminal of the solid state relay.

4. The solid state relay according to claim 3, wherein the at least one galvanic isolator is an opto-coupler, a magneto-coupler or a piezo-coupler.

5. The solid state relay according to claim 1, wherein the detection circuit includes a current zero crossing detector.

6. The solid state relay according to claim 5, wherein the evaluation circuit includes a voltage zero crossing detector.

7. The solid state relay according to claim 6, wherein the voltage zero crossing detector generates a logical signal indicating whether an absolute value of the voltage across the power semiconductor is higher or lower than a certain level.

8. The solid state relay according to claim 6, wherein the evaluation circuit includes a gate circuit for generating the output signal which is supplied to the gate electrode of the power semiconductor.

9. The solid state relay according to claim 8, wherein the voltage zero crossing detector and the current zero crossing detector are coupled to the gate circuit.

10. The solid state relay according to claim 8, wherein the current zero crossing detector is responsive to a logical signal generated by the at least one current detector indicating whether the absolute value of the current through the main path of the power semiconductor is higher or lower than a certain level.

11. The solid state relay according to claim 9, wherein the evaluation circuit generates the output signal indicating when the voltage zero crossing detector and the current zero crossing detector generate output signals indicating a voltage zero condition and a current zero condition simultaneously.

12. The solid state relay according to claim 1, wherein the evaluation circuit includes a monitor circuit for monitoring voltage and current conditions of the at least one power semiconductor.

13. The solid state relay according to claim 12, wherein the monitor circuit includes a phase shift calculator to generate an output signal when there is a phase shift between the voltage and current of the at least one power semiconductor that is outside certain limits.

14. The solid state relay according to claim 1, further comprising at least two connection terminals, one of the connection terminals being connected to a load and the other of the connection terminals being connected to a main power source such that the current passes through the load.

15. The solid state relay according to claim 14, wherein the power semiconductor is connected across the connection terminals in such a way that one of the two electrodes of the power semiconductor is connected to one of the two connection terminals and the other of the two electrodes of the power semiconductor is connected to the other of the connection terminals.

16. The solid state relay according to claim 14, wherein the main power source is an alternating current (AC) power source.

17. The solid state relay according to claim 1, further comprising a gate pulse generator coupled in between the evaluation circuit and the gate electrode of said power semiconductor.

18. The solid state relay according to claim 17, wherein the gate pulse generator includes an amplifier to generate a trigger signal to fire the power semiconductor.

19. The solid state relay according to claim 1, wherein the power semiconductor is a silicon-controlled rectifier.

20. The solid state relay according to claim 1, further comprising a power supply connected to the solid state relay.

21. The solid state relay according to claim 20, wherein the power supply includes an input for a control signal (S0).

22. The solid state relay according to claim 1, wherein the power supply includes a DC/DC-converter.

23. The solid state relay according to claim 1, wherein a frequency of the carrier signal is several times higher than a frequency of the main power source.

24. The solid state relay according to claim 23, wherein said detection circuit is an AM-demodulator.

25. The solid state relay according to claim 1, wherein said ferromagnetic core has a magnetic permeability such that it is close to its magnetic saturation for a maximum current of interest in the main path.

26. The solid state relay according to anyone of claim 1, wherein the at least one current detector further comprises at least one resistor coupled to the coil and a capacitor coupled to the at least one resistor; the coil, the at least one resistor and the capacitor forming a filter.

27. The solid state relay according to claim 26, wherein the filter has a transfer function which depends on the inductance of the coil.

28. The solid state relay according to claim 27, wherein a cutoff frequency of the filter is dependent on the inductance of the coil.

29. The solid state relay according to claim 1, wherein the power semiconductor is a bidirectional triode thyristor.

* * * * *

UNITED STATES PATENT AND TRADEMARK OFFICE
CERTIFICATE OF CORRECTION

PATENT NO. : 6,054,891
DATED : April 25, 2000
INVENTOR(S) : Uffe Noe CHRISTIANSEN It is certified that error appears in the above-identified patent and that said Letters Patent is hereby corrected as shown below:

On the Title Page Assignee should read:

--Carlo Gavazzi Services AG--

Signed and Sealed this

Twenty-second Day of May, 2001

Attest:

NICHOLAS P. GODICI

Attesting Officer

Acting Director of the United States Patent and Trademark Office